United States Patent
Sze et al.

(10) Patent No.: US 7,710,296 B2
(45) Date of Patent: May 4, 2010

(54) N-BIN ARITHMETIC CODING FOR CONTEXT ADAPTIVE BINARY ARITHMETIC CODING

(75) Inventors: Vivienne Sze, Toronto (CA); Madhukar Budagavi, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 12/233,896

(22) Filed: Sep. 19, 2008

(65) Prior Publication Data

US 2009/0079602 A1    Mar. 26, 2009

Related U.S. Application Data

(60) Provisional application No. 60/973,559, filed on Sep. 19, 2007, provisional application No. 61/045,187, filed on Apr. 15, 2008.

(51) Int. Cl.
*H03M 7/00* (2006.01)

(52) U.S. Cl. .................................. 341/107; 382/247

(58) Field of Classification Search .............. 341/107; 382/247

See application file for complete search history.

(56) References Cited

U.S. PATENT DOCUMENTS 5,587,710 A * 12/1996 Choo et al. ............... 341/107
7,176,815 B1 * 2/2007 Hung et al. ............... 341/107

\* cited by examiner

*Primary Examiner*—Khai M Nguyen
(74) *Attorney, Agent, or Firm*—Robert D. Marshall, Jr.; W. James Brady; Frederick J. Telecky, Jr.

(57) ABSTRACT

A method of context adaptive binary arithmetic coding and decoding groups a plurality N binary symbols in corresponding syntax elements and divides a range into $2^N$ subranges based upon corresponding contexts. The invention encodes data by selecting an offset determined by the probability states of the context of the N binary symbols. Decoding is similar with the place of the coded offset within the $2^N$ subranges determining the syntax decoding. When the total number of binary symbols to be coded does not equal an integral multiple of N, the invention codes dummy binary symbols at the end of a grouping of a plurality N binary symbols. Probability state updates occur only following every N binary symbols.

12 Claims, 6 Drawing Sheets

(1) L1I CACHE MISS FILL FROM L2
(2) L1D CACHE MISS FILL FROM L2
(3) L1D WRITE MISS TO L2, OR L1D VICTIM TO L2, OR L1D SNOOP RESPONSE TO L2
(4) L2 CACHE MISS FILL, OR DMA INTO L2
(5) L2 VICTIM WRITE BACK, OR DMA OUT OF L2
(6) DMA INTO L2
(7) DMA OUT OF L2

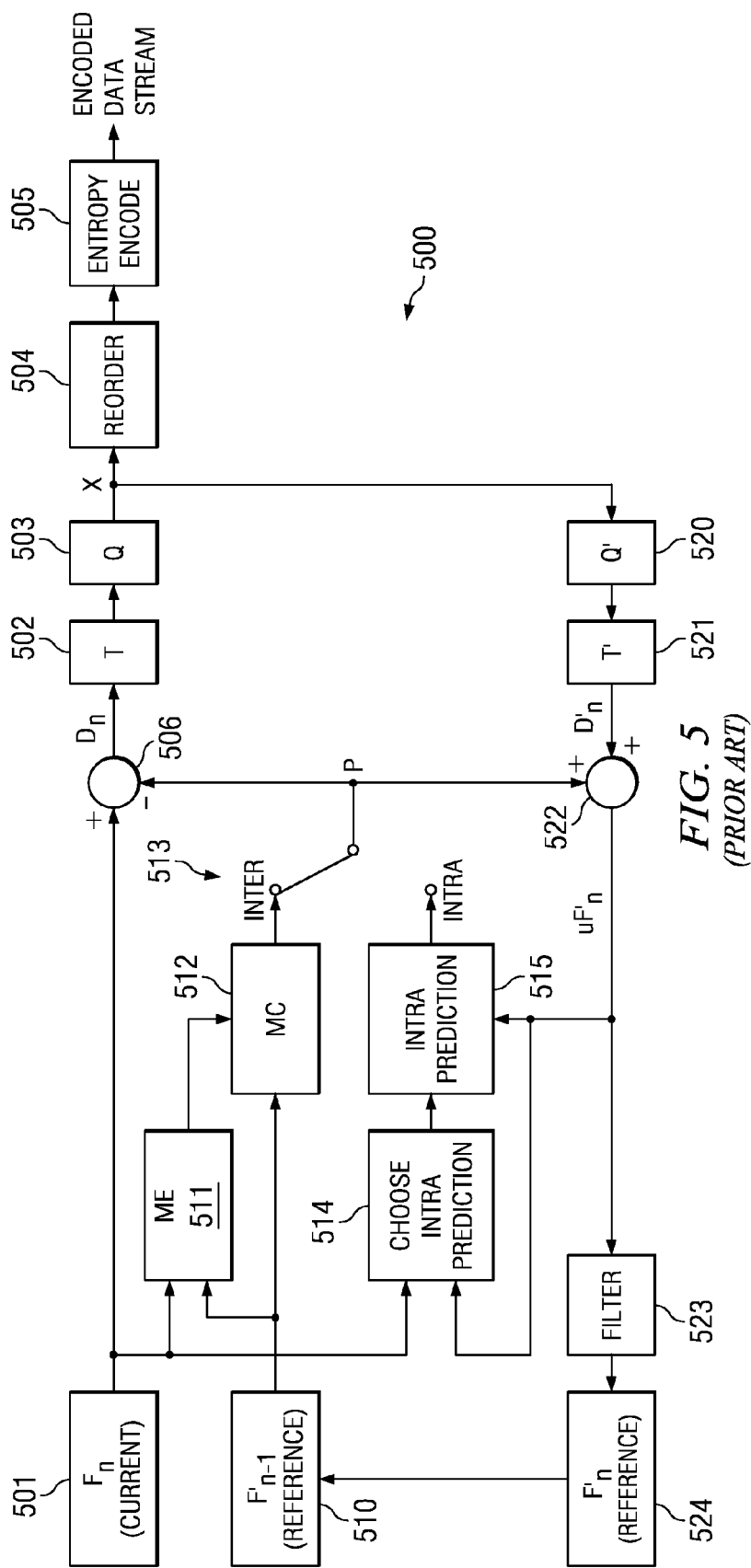

N-BIN ARITHMETIC CODING FOR CONTEXT ADAPTIVE BINARY ARITHMETIC CODING

CLAIM OF PRIORITY

This application claims priority under 35 U.S.C. 119(e)(1) to U.S. Provisional Application No. 60/973,559 filed Sep. 19, 2007 and U.S. Provisional Application No. 61/045,187 filed Apr. 15, 2008.

TECHNICAL FIELD OF THE INVENTION

The technical field of this invention is video data coding.

BACKGROUND OF THE INVENTION

New video conferencing encoding standards such as H.264 employ Context Adaptive Binary Arithmetic Coding (CABAC) for its high compression efficiency. In CABAC data is encoded based upon the probability distributions of the data and the relationship between the most probable next data and other data. The most probable data is encoded in fewer bits than other sequential data. The most probable data is encoded in fewer bits than other data and the probabilities are updated sequentially. Many types of image data can be transmitted in this form. This application discloses an example of encoding of a significance map, but other data types are feasible.

Image data compression often employs a spatial to frequency transform of blocks of image data known as macroblocks. A Discrete Cosine Transform (DCT) is typically used for this spatial to frequency transform. Most images have more information in the low frequency bands than in the high frequency bands. It is typical to arrange and encode such data in frequency order from low frequency to high frequency. Generally such an arrangement of data will produce a highest frequency with significant data that is lower than the highest possible encoded frequency. This permits the data for frequencies higher than the highest frequency with significant data to be coded via an end-of-block code. Such an end-of-block code implies all remaining higher frequency data is insignificant. This technique saves coding the bits that might have been devoted to the higher frequency data. The significance map is one form of encoding described above.

The H.264 video conferencing coding standard uses significance map to perform run-level information encoding after quantization. Every coefficient that is non-significant (zero) is encoded as 0. If a coefficient is significant, that is non-zero, and it is not the last such significant coefficient in the block, then it is encoded as 10. If the coefficient is the last significant coefficient in the block, then it is encoded as 11. If the coefficient is significant and is also the last possible coefficient in the block, then it is encoded as 10. Such a coefficient would be known as the last coefficient in the block by a count of the block coefficients.

A straight forward manner of CABAC decoding such data employs a series of conditional branches. Such conditional branching code is not well matched to a pipelined data processor which experiences a pipeline hit upon each conditional branch. Each taken conditional branch requires that later instructions already partially executed within the pipeline to be aborted and new instructions need be processed within the pipeline. This serves to place a limit on processing speed because data processors tend to be more deeply pipelined at higher operating frequencies. Software loop unrolling may reduce this problem. In any event, conventional CABAC decoding is not well matched to exploiting instruction level parallelism of a very long instruction word (VLIW) data processor such as the Texas Instruments TMS320C6000 series.

SUMMARY OF THE INVENTION

This invention is a method of context adaptive binary arithmetic coding and decoding on multiple binary symbols per cycle. For coding the invention groups a plurality of N binary symbols (bins) which belong to one or more syntax elements. The invention divides a range into $2^N$ subranges. The initial syntax element divides said range into two subranges according to the probability state of the binary symbol's context. The corresponding probability of the next context corresponding to next syntax elements divides each prior subrange into two parts. This repeats for all N syntax elements. The invention selects an offset found in the subrange determined by the digital states of the N syntax elements according to corresponding contexts. Decoding is similar with the place of the coded offset within the $2^N$ subranges determining the syntax decoding. When the total number of syntax elements to be coded does not equal an integral multiple of N, the invention codes dummy binary symbols at the end of a grouping of a plurality N binary symbols. This method can be used across syntax element types as a significance map and corresponding coefficient levels can be coded and decoded together. The invention also updates the probability state of the context only after every N binary symbols are coded. It uses a true multiplication rather than a look up table to compute the product of N probabilities for the N binary symbols.

The CABAC engine proposed here is suitable for ASIC implementations and very long instruction word (VLIW) data processor such as the Texas Instruments TMS320C6000 series providing flexibility in the number of parallel units that can be used for processing.

BRIEF DESCRIPTION OF THE DRAWINGS

These and other aspects of this invention are illustrated in the drawings, in which:

FIG. 4 illustrates the instruction syntax of the very long instruction word digital signal processor core illustrated in FIG. 2 (prior art);

FIG. 5 illustrates an overview of the video encoding process of the prior art;

DETAILED DESCRIPTION OF PREFERRED EMBODIMENTS

Figure 1:
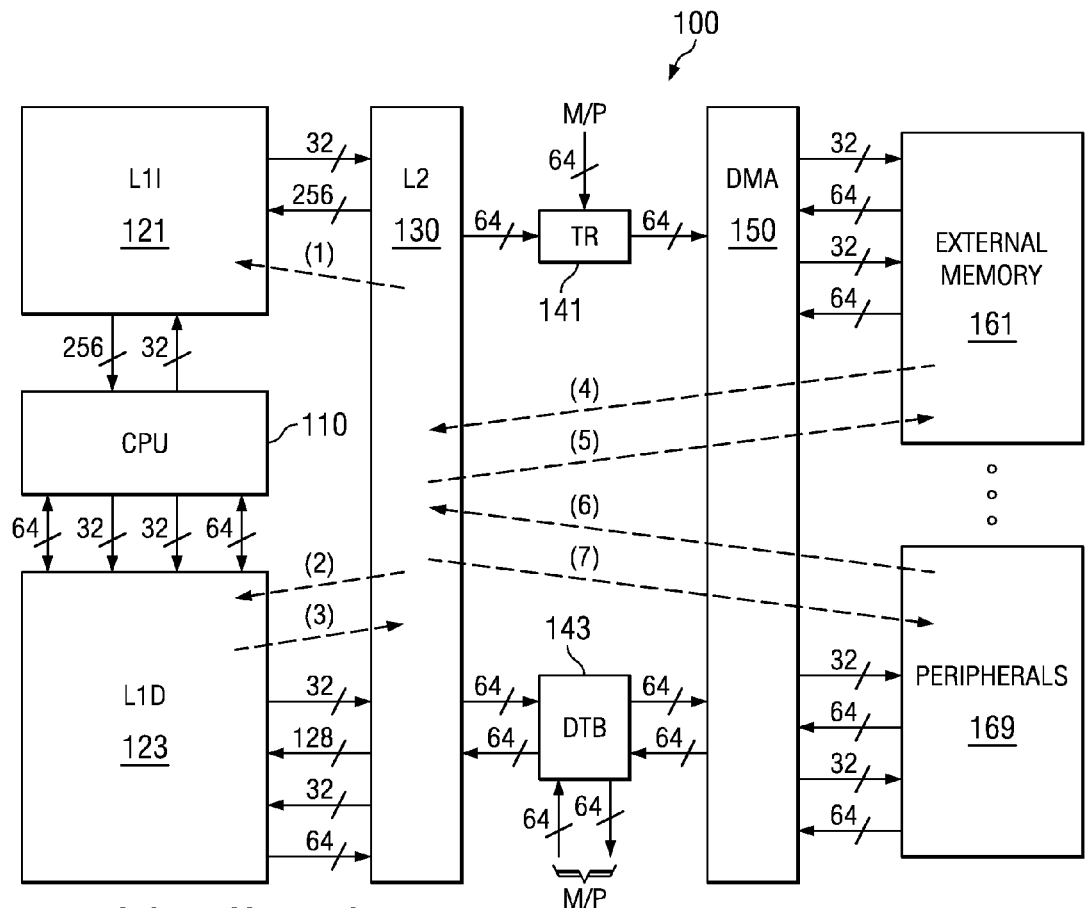
FIG. 1 illustrates the organization of a typical digital signal processor to which this invention is applicable (prior art)

FIG. 1 illustrates the organization of a typical digital signal processor system 100 to which this invention is applicable (prior art). Digital signal processor system 100 includes central processing unit core 110. Central processing unit core 110 includes the data processing portion of digital signal processor system 100. Central processing unit core 110 could be constructed as known in the art and would typically includes a register file, an integer arithmetic logic unit, an integer multiplier and program flow control units. An example of an appropriate central processing unit core is described below in conjunction with FIGS. 2 to 4.

Digital signal processor system 100 includes a number of cache memories. FIG. 1 illustrates a pair of first level caches. Level one instruction cache (L1I) 121 stores instructions used by central processing unit core 110. Central processing unit core 110 first attempts to access any instruction from level one instruction cache 121. Level one data cache (L1D) 123 stores data used by central processing unit core 110. Central processing unit core 110 first attempts to access any required data from level one data cache 123. The two level one caches are backed by a level two unified cache (L2) 130. In the event of a cache miss to level one instruction cache 121 or to level one data cache 123, the requested instruction or data is sought from level two unified cache 130. If the requested instruction or data is stored in level two unified cache 130, then it is supplied to the requesting level one cache for supply to central processing unit core 110. As is known in the art, the requested instruction or data may be simultaneously supplied to both the requesting cache and central processing unit core 110 to speed use.

Level two unified cache 130 is further coupled to higher level memory systems. Digital signal processor system 100 may be a part of a multiprocessor system. The other processors of the multiprocessor system are coupled to level two unified cache 130 via a transfer request bus 141 and a data transfer bus 143. A direct memory access unit 150 provides the connection of digital signal processor system 100 to external memory 161 and external peripherals 169.

Figure 2:
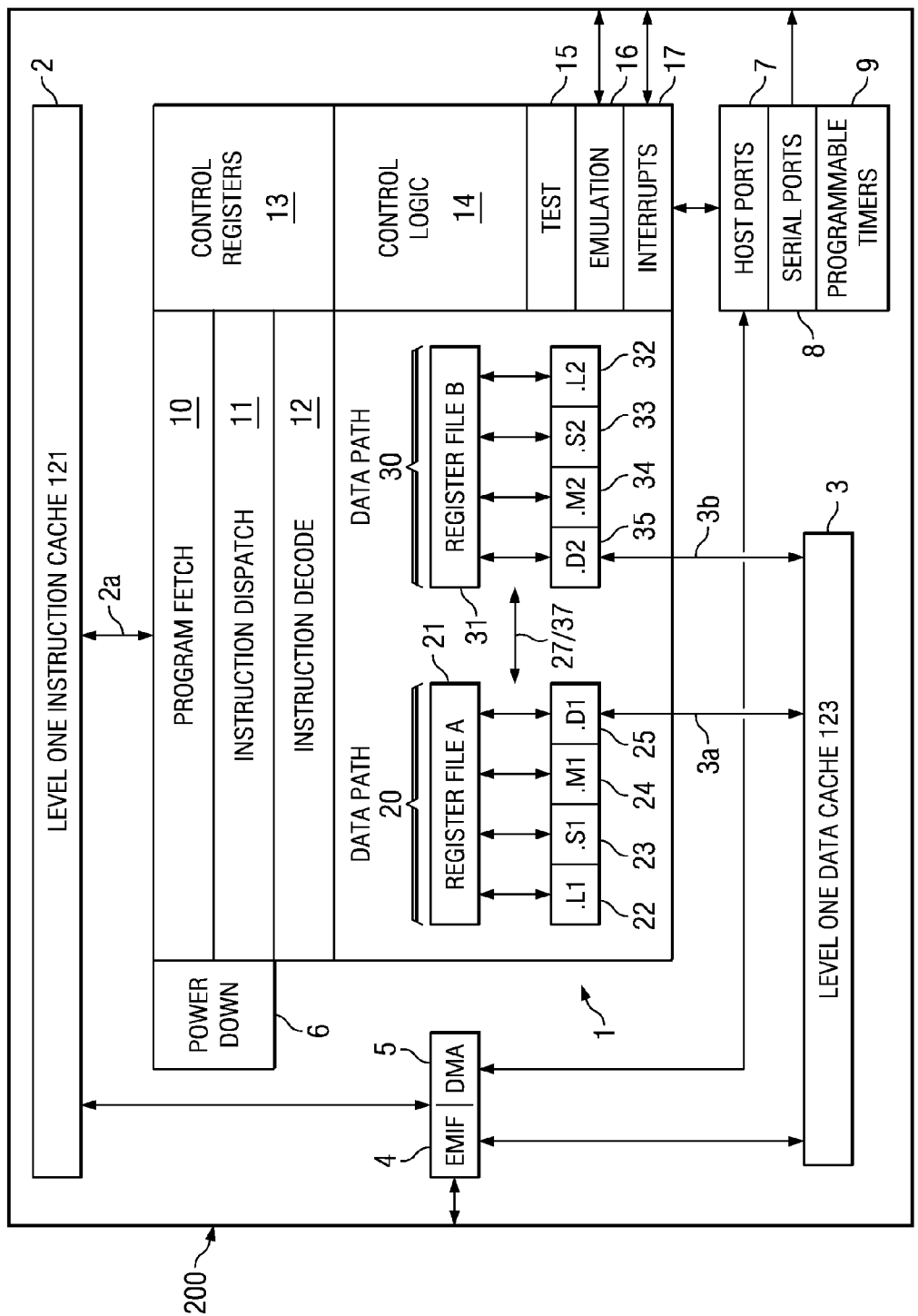
FIG. 2 illustrates details of a very long instruction word digital signal processor core suitable for use in FIG. 1 (prior art)

FIG. 2 is a block diagram illustrating details of a digital signal processor integrated circuit 200 suitable but not essential for use in this invention (prior art). The digital signal processor integrated circuit 200 includes central processing unit 1, which is a 32-bit eight-way VLIW pipelined processor. Central processing unit 1 is coupled to level one instruction cache 121 included in digital signal processor integrated circuit 200. Digital signal processor integrated circuit 200 also includes level one data cache 123. Digital signal processor integrated circuit 200 also includes peripherals 4 to 9. These peripherals preferably include an external memory interface (EMIF) 4 and a direct memory access (DMA) controller 5. External memory interface (EMIF) 4 preferably supports access to supports synchronous and asynchronous SRAM and synchronous DRAM. Direct memory access (DMA) controller 5 preferably provides 2-channel auto-boot loading direct memory access. These peripherals include power-down logic 6. Power-down logic 6 preferably can halt central processing unit activity, peripheral activity, and phase lock loop (PLL) clock synchronization activity to reduce power consumption. These peripherals also include host ports 7, serial ports 8 and programmable timers 9.

Central processing unit 1 has a 32-bit, byte addressable address space. Internal memory on the same integrated circuit is preferably organized in a data space including level one data cache 123 and a program space including level one instruction cache 121. When off-chip memory is used, preferably these two spaces are unified into a single memory space via the external memory interface (EMIF) 4.

Level one data cache 123 may be internally accessed by central processing unit 1 via two internal ports 3*a* and 3*b*. Each internal port 3*a* and 3*b* preferably has 32 bits of data and a 32-bit byte address reach. Level one instruction cache 121 may be internally accessed by central processing unit 1 via a single port 2*a*. Port 2*a* of level one instruction cache 121 preferably has an instruction-fetch width of 256 bits and a 30-bit word (four bytes) address, equivalent to a 32-bit byte address.

Central processing unit 1 includes program fetch unit 10, instruction dispatch unit 11, instruction decode unit 12 and two data paths 20 and 30. First data path 20 includes four functional units designated L1 unit 22, S1 unit 23, M1 unit 24 and D1 unit 25 and 16 32-bit A registers forming register file 21. Second data path 30 likewise includes four functional units designated L2 unit 32, S2 unit 33, M2 unit 34 and D2 unit 35 and 16 32-bit B registers forming register file 31. The functional units of each data path access the corresponding register file for their operands. There are two cross paths 27 and 37 permitting access to one register in the opposite register file each pipeline stage. Central processing unit 1 includes control registers 13, control logic 14, and test logic 15, emulation logic 16 and interrupt logic 17.

Program fetch unit 10, instruction dispatch unit 11 and instruction decode unit 12 recall instructions from level one instruction cache 121 and deliver up to eight 32-bit instructions to the functional units every instruction cycle. Processing occurs simultaneously in each of the two data paths 20 and 30. As previously described each data path has four corresponding functional units (L, S, M and D) and a corresponding register file containing 16 32-bit registers. Each functional unit is controlled by a 32-bit instruction. The data paths are further described below. A control register file 13 provides the means to configure and control various processor operations.

Figure 3:
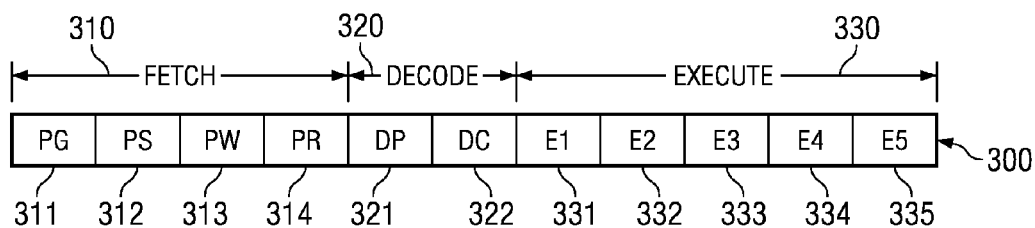
FIG. 3 illustrates the pipeline stages of the very long instruction word digital signal processor core illustrated in FIG. 2 (prior art)

FIG. 3 illustrates the pipeline stages 300 of digital signal processor core 110 (prior art). These pipeline stages are divided into three groups: fetch group 310; decode group 320; and execute group 330. All instructions in the instruction set flow through the fetch, decode, and execute stages of the pipeline. Fetch group 310 has four phases for all instructions, and decode group 320 has two phases for all instructions. Execute group 330 requires a varying number of phases depending on the type of instruction.

The fetch phases of the fetch group 310 are: Program address generate phase 311 (PG); Program address send phase 312 (PS); Program access ready wait stage 313 (PW); and Program fetch packet receive stage 314 (PR). Digital signal processor core 110 uses a fetch packet (FP) of eight instructions. All eight of the instructions proceed through fetch group 310 together. During PG phase 311, the program address is generated in program fetch unit 10. During PS phase 312, this program address is sent to memory. During PW phase 313, the memory read occurs. Finally during PR phase 314, the fetch packet is received at CPU 1.

The decode phases of decode group 320 are: Instruction dispatch (DP) 321; and Instruction decode (DC) 322. During the DP phase 321, the fetch packets are split into execute packets. Execute packets consist of one or more instructions which are coded to execute in parallel. During DP phase 322, the instructions in an execute packet are assigned to the appropriate functional units. Also during DC phase 322, the source registers, destination registers and associated paths are decoded for the execution of the instructions in the respective functional units.

The execute phases of the execute group 330 are: Execute 1 (E1) 331; Execute 2 (E2) 332; Execute 3 (E3) 333; Execute 4 (E4) 334; and Execute 5 (E5) 335. Different types of instructions require different numbers of these phases to complete. These phases of the pipeline play an important role in understanding the device state at CPU cycle boundaries.

During E1 phase 331, the conditions for the instructions are evaluated and operands are read for all instruction types. For load and store instructions, address generation is performed and address modifications are written to a register file. For branch instructions, branch fetch packet in PG phase 311 is affected. For all single-cycle instructions, the results are written to a register file. All single-cycle instructions complete during the E1 phase 331.

During the E2 phase 332, for load instructions, the address is sent to memory. For store instructions, the address and data are sent to memory. Single-cycle instructions that saturate results set the SAT bit in the control status register (CSR) if saturation occurs. For single cycle 16 by 16 multiply instructions, the results are written to a register file. For M unit non-multiply instructions, the results are written to a register file. All ordinary multiply unit instructions complete during E2 phase 322.

During E3 phase 333, data memory accesses are performed. Any multiply instruction that saturates results sets the SAT bit in the control status register (CSR) if saturation occurs. Store instructions complete during the E3 phase 333.

During E4 phase 334, for load instructions, data is brought to the CPU boundary. For multiply extension instructions, the results are written to a register file. Multiply extension instructions complete during the E4 phase 334.

During E5 phase 335, load instructions write data into a register. Load instructions complete during the E5 phase 335.

FIG. 4 illustrates an example of the instruction coding of instructions used by digital signal processor core 110 (prior art). Each instruction consists of 32 bits and controls the operation of one of the eight functional units. The bit fields are defined as follows. The creg field (bits 29 to 31) is the conditional register field. These bits identify whether the instruction is conditional and identify the predicate register. The z bit (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field is encoded in the instruction opcode as shown in Table 1.

TABLE 1

| Conditional Register | creg | | | z |
|---|---|---|---|---|
| | 31 | 30 | 29 | 28 |
| Unconditional | 0 | 0 | 0 | 0 |
| Reserved | 0 | 0 | 0 | 1 |
| B0 | 0 | 0 | 1 | z |
| B1 | 0 | 1 | 0 | z |
| B2 | 0 | 1 | 1 | z |
| A1 | 1 | 0 | 0 | z |
| A2 | 1 | 0 | 1 | z |
| A0 | 1 | 1 | 0 | z |
| Reserved | 1 | 1 | 1 | x |

Note that "z" in the z bit column refers to the zero/not zero comparison selection noted above and "x" is a don't care state. This coding can only specify a subset of the 32 registers in each register file as predicate registers. This selection was made to preserve bits in the instruction coding.

The dst field (bits 23 to 27) specifies one of the 32 registers in the corresponding register file as the destination of the instruction results.

The scr2 field (bits 18 to 22) specifies one of the 32 registers in the corresponding register file as the second source operand.

The scr1/cst field (bits 13 to 17) has several meanings depending on the instruction opcode field (bits 3 to 12). The first meaning specifies one of the 32 registers of the corresponding register file as the first operand. The second meaning is a 5-bit immediate constant. Depending on the instruction type, this is treated as an unsigned integer and zero extended to 32 bits or is treated as a signed integer and sign extended to 32 bits. Lastly, this field can specify one of the 32 registers in the opposite register file if the instruction invokes one of the register file cross paths 27 or 37.

The opcode field (bits 3 to 12) specifies the type of instruction and designates appropriate instruction options. A detailed explanation of this field is beyond the scope of this invention except for the instruction options detailed below.

The s bit (bit 1) designates the data path 20 or 30. If s=0, then data path 20 is selected. This limits the functional unit to L1 unit 22, S1 unit 23, M1 unit 24 and D1 unit 25 and the corresponding register file A 21. Similarly, s=1 selects data path 20 limiting the functional unit to L2 unit 32, S2 unit 33, M2 unit 34 and D2 unit 35 and the corresponding register file B 31.

The p bit (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to eight instructions. Each instruction in an execute packet must use a different functional unit.

FIG. 5 illustrates the encoding process 500 of video encoding according to the prior art. Many video encoding standards use similar processes such as represented in FIG. 5. Encoding process 500 begins with the n th (current) frame $F_n$ 501. Frequency transform block 502 transforms a macroblock of the pixel data into the spatial frequency domain. This typically involves a discrete cosine transform (DCT). This frequency domain data is quantized in quantization block 503. This quantization typically takes into account the range of data values for the current macroblock. Thus differing macroblocks may have differing quantizations. In accordance with the H.264 standard, in the base profile the macroblock data may be arbitrarily reordered via reorder block 504. As will be explained below, this reordering is reversed upon decoding. Other video encoding standards and the H.264 main profile transmit data for the macroblocks in strict raster scan order. The quantized data is encoded by entropy encoding block 505. Entropy encoding employs fewer bits to encode more frequently used symbols and more bits to encode less frequency used symbols. This process reduces the amount of encoded that must be transmitted and/or stored. The resulting entropy encoded data is the encoded data stream. This invention concerns content adaptive binary arithmetic coding (CABAC) which will be further described below.

Video encoding standards typically permit two types of predictions. In inter-frame prediction, data is compared with data from the corresponding location of another frame. In intra-frame prediction, data is compared with data from another location in the same frame.

For inter prediction, data from n−1 th (previous) frame $F_{n-1}$ 510 and data from the n th frame $F_n$ 501 supply motion estimation block 511. Motion estimation block 511 determines the positions and motion vectors of moving objects within the picture. This motion data is supplied to motion compensation block 512 along with data from n−1 th frame $F_{n-1}$ 510. The resulting motion compensated frame data is selected by switch 513 for application to subtraction unit 506. Subtraction unit 506 subtracts the inter prediction data from switch 513 from the input frame data from n th frame $F_n$ 501. Thus frequency transform block 502, quantization block 503, reorder block 504 and entropy encoding block 505 encode the differential data rather than the original frame data. Assuming there is relatively little change from frame to frame, this differential data has a smaller magnitude than the raw frame data. Thus this can be expressed in fewer bits contributing to data compression. This is true even if motion estimation block 511 and motion compensation block 512 find no moving objects to code. If the n th frame $F_n$ and the n−1 th frame $F_{n-1}$ are identical, the subtraction unit 506 will produce a string of zeros for data. This data string can be encoded using few bits.

The second type of prediction is intra prediction. Intra prediction predicts a macroblock of the current frame from another macroblock of the current frame. Inverse quantization block 520 receives the quantized data from quantization block 503 and substantially recovers the original frequency domain data. Inverse frequency transform block 521 transforms the frequency domain data from inverse quantization block 520 back to the spatial domain. This spatial domain data supplies one input of addition unit 522, whose function will be further described. Encoding process 500 includes choose intra predication unit 514 to determine whether to implement intra prediction. Choose intra prediction unit 514 receives data from n th frame $F_n$ 501 and the output of addition unit 522. Choose intra prediction unit 514 signals intra prediction intra predication unit 515, which also receives the output of addition unit 522. Switch 513 selects the intra prediction output for application to the subtraction input of subtraction units 506 and an addition input of addition unit 522. Intra prediction is based upon the recovered data from inverse quantization block 520 and inverse frequency transform block 521 in order to better match the processing at decoding. If the encoding used the original frame, there might be drift between these processes resulting in growing errors.

Video encoders typically periodically transmit unpredicted frames. In such an event the predicted frame is all 0's. Subtraction unit 506 thus produces data corresponding to the n th frame $F_n$ 501 data. Periodic unpredicted or I frames limits any drift between the transmitter coding and the receive decoding. In a video movie a scene change may produce such a large change between adjacent frames that differential coding provides little advantage. Video coding standards typically signal whether a frame is a predicted frame and the type of prediction in the transmitted data stream.

Encoding process 500 includes reconstruction of the frame based upon this recovered data. The output of addition unit 522 supplies deblock filter 523. Deblock filter 523 smoothes artifacts created by the block and macroblock nature of the encoding process. The result is reconstructed frame $F'_n$ 524. As shown schematically in FIG. 5, this reconstructed frame $F'_n$ 524 becomes the next reference frame $F_{n-1}$ 510.

Figure 6:
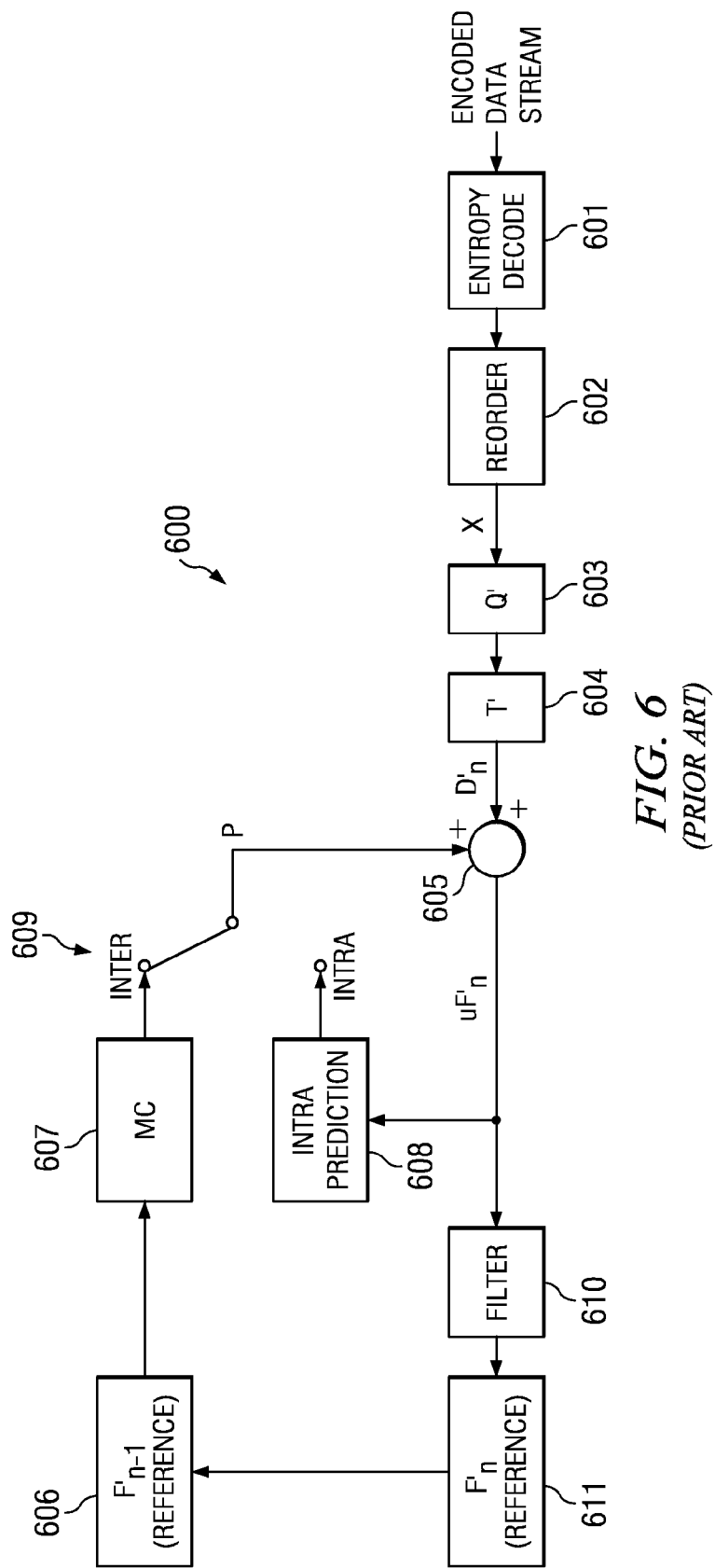
FIG. 6 illustrates an overview of the video decoding process of the prior art.

FIG. 6 illustrates the corresponding decoding process 600. Entropy decode unit 601 receives the encoded data stream. Entropy decode unit 601 recovers the symbols from the entropy encoding of entropy encoding unit 505. This invention is applicable to CABAC decoding. Reorder unit 602 assembles the macroblocks in raster scan order reversing the reordering of reorder unit 504. Inverse quantization block 603 receives the quantized data from reorder unit 602 and substantially recovers the original frequency domain data. Inverse frequency transform block 604 transforms the frequency domain data from inverse quantization block 603 back to the spatial domain. This spatial domain data supplies one input of addition unit 605. The other input of addition input 605 comes from switch 609. In inter prediction mode switch 609 selects the output of motion compensation unit 607. Motion compensation unit 607 receives the reference frame $F'_{n-1}$ 606 and applies the motion compensation computed by motion compensation unit 512 and transmitted in the encoded data stream.

Switch 609 may also select an intra prediction mode. The intra prediction is signaled in the encoded data stream. If this is selected, intra prediction unit 608 forms the predicted data from the output of adder 605 and then applies the intra prediction computed by intra prediction block 515 of the encoding process 500. Addition unit 605 recovers the predicted frame. As previously discussed in conjunction with encoding, it is possible to transmit an unpredicted or I frame. If the data stream signals that a received frame is an I frame, then the predicted frame supplied to addition unit 605 is all 0's.

The output of addition unit 605 supplies the input of deblock filter 610. Deblock filter 610 smoothes artifacts created by the block and macroblock nature of the encoding process. The result is reconstructed frame $F'_n$ 611. As shown schematically in FIG. 6, this reconstructed frame $F'_n$ 611 becomes the next reference frame $F_{n-1}$ 606.

The deblocking filtering of deblock filter 523 and deblock 610 must be the same. This enables the decoding process to accurately reflect the input frame $F_n$ 501 without error drift. The H.264 standard has a specific, very detailed decision matrix and corresponding filter operations for this process. The standard deblock filtering is applied to every macroblock in raster scan order. This deblock filtering smoothes artifacts created by the block and macroblock nature of the encoding. The filtered macroblock is used as the reference frame in predicted frames in both encoding and decoding. The encoding and decoding apply the identical processing the reconstructed frame to reduce the residual error after prediction.

Current CABAC implementation for the H.246 standard have limited throughput because its arithmetic coding engine is limited to encoding/decoding a single binary symbol (bin) per cycle. Thus to meet performance requirements of high definition video bit-streams, the CABAC engine needs to run at extremely high frequencies. This either consumes a significant amount of power or is not feasible. Other standards such as SVC, MVC and China AVS have similar issues.

Context-Adaptive Binary Arithmetic Coding (CABAC) is one of two entropy coding techniques used by the video coding standard H.264. This coding compresses the video bit-stream. In the standard H.264 CABAC, the significance map information dominates the total number bins in the average case while the coefficient level information dominates in the worst case (maximum number of bins per macroblock). For a typical 720p resolution video, the significance map bins are 47% of the bins when QP=22 and 39% when QP=27 in the average case. For a typical 720p resolution video, the coefficient level bins are 60% of the total bins when QP=22 and 52% when QP=27 in the worst case. Together these two types of syntax elements make up 69% for QP=22 and 54% for QP=27 in the average case, and 98% of the bins for both QP=22 and QP=27 in the worst case. Accordingly, this description focuses these two syntax elements to demonstrate that this invention increases throughput during the encoding/decoding. Note that this invention can be extended to all the other syntax element types.

Context adaptive binary arithmetic coding (CABAC) employs recursive interval subdivision. The next subinterval size is the product of a current subinterval range and the estimated probability of the least probable symbol (LBS). When encoding the next subinterval is selected based upon whether the current symbol is encoded as a LBS or a most probable symbol (MPS). When decoding the value of the next bin (LPS/MPS) is determined by which subinterval includes the offset. In either encoding or decoding, the current interval range has a limited bit precision requiring renormalization when the range becomes too small.

A set of carefully chosen probabilities are used in bin encoding and decoding. Bins of the same type with the same probability distribution and character are grouped together in contexts. The probabilities used for each context are modeled via a process called source modeling. Bins generally have non-stochastic distributions requiring continual updates by a context modeler. In coding the interval is recursively divided based upon whether the bins encoded are LPS or MPS. The encoding process tracks a current interval range R and a position of the lowest value L. For each bin the corresponding context determines the division between the portion of the range devoted to the LPS and the MPS. The range R and lowest value L are reset following each bin determination as shown in the following pseudo code which assumes the most probable symbol is 0:

```
If Input = 0
    R_{n+1} = R_n*P_A(0)
    L_{n+1} = L
else
    R_{n+1} = R_n*P_A(1)
    L_{n+1} = L_n + R_n*P(0)
``` where: $P_A(0)$ is the probability of 0 taken from the corresponding context A; and $P_A(1)$ is the probability of 1 taken from the corresponding context A. After all binary bits are encoded the final L is a binary fraction corresponding to the sequence of bins. Decoding involves a reverse process. A bin is decoded by identifying which subinterval the quantity L is located. The size of the subinterval is determine by the probability state of the context of the bin. The next comparison is based upon the results of all prior decodings. In practice the context may change for each bin in encoding and decoding.

The H.264 coding includes significance maps to mark the locations of zero and non-zero coefficients. The significance map information includes significant_coeff_flag and last_significant_coeff_flag syntax elements. The significance map uses 0 and 1 to mark the location of non-zero coefficients. A 0 in the significant_coeff_flag indicates that the corresponding coefficient is zero. These coefficients are not further coded but only noted in the significance map. A 1 in the significant_coeff_flag indicates the corresponding coefficient is non-zero. A significant_coeff_flag with value 1 is followed by a last_significant_coeff_flag to indicate whether this is the last non-zero coefficient in the transform. The non-zero coefficients levels then are separately encoded. This non-zero coefficient level information consists of the syntax elements coeff_abs_level_minus1 and coeff_sign_flag. Unlike the significance map, binarization is required on coeff_abs_level_minus1 to map the syntax elements to binary symbols.

This invention uses a parallel arithmetic coding scheme that can encode and decode multiple (N) bins at a time. A 2-bin per cycle arithmetic coding engine can be used on the significance map bins as well as coefficient level bins to reduce the required number of cycles. One issue with an N-bin per cycle coding is how to address the case when the number of bins does not equal a multiple of N. For a 2-bin per cycle case his invention inserts a dummy bin for odd runs of significance map elements and coefficient level elements. Simulations indicate that this results in a bin increase of less than 1.5%. Since the dummy bin is always a zero, a highly skewed probability can be used for the encoding/decoding dummy bins resulting in a negligible increase in bits. Thus the compression efficiency remains nearly the same. For the case of a probability pf 0.01, the increase in bits is about 0.03%.

During encoding the values for a sequence of bins to be compressed are known a priori. Thus the contexts to be used for each bin are also known and multiple (N) bins can be encoded in parallel. For example, suppose the next two bins belong to respective contexts A and B. Two bins can be can encoded at the same time using the probabilities shown in Table 2.

TABLE 2

| First Bin | Second Bin | Probability |
|---|---|---|
| 0 | 0 | $(1 - P_A[1]) * (1 - P_B[1])$ |
| 0 | 1 | $(1 - P_A[1]) * P_B[1]$ |
| 1 | 0 | $P_A[1] * (1 - P_B[1])$ |
| 1 | 1 | $P_A[1] * P_B[1]$ |

CABAC uses adaptive contexts to improve its compression efficiency. Each syntax element (and in some cases each bin position within the syntax element) has its own set of contexts which dictate the probabilities that should be used to encode/decode that bin. To properly decode 2-bins at a time, the context of each bin must be know beforehand. In addition, the two bins may have different contexts and different probability distributions.

This becomes problem when performing 2-bin decoding across syntax elements and codewords. Coding across syntax elements means that the two bins may or may not belong to the same element. At the decoder the syntax element and thus context of the two bins are not known a priori. Specifically, the context of the first bin may be known, but syntax element to which the second bin belongs may not be known until the first bin is decoded. This is a problem since both bins are decoded simultaneously. The second bin can be a bin in the current syntax element or the first bin in the next syntax element. Thus the second bin can be one of two different syntax elements, neither of which must to be the same as the first bin. For instance, in coding the significance map bins, the first bin may be known as a significant_coeff_flag, but it is not known whether the second bin is significant_coeff_flag or last_coeff_flag. This depends whether the first bin is a 0 or 1. This is a particularly severe issue for the coefficient level bins where the first bin of the coeff_abs_level_minus1 codewords has a different context than the rest of the bins. Failing to properly identify the transition between codewords immediately and thus assigning the wrong context to this first bin can cause a 5% increase in number of bits.

This invention conditions the probabilities of the second bin based on the first bin and uses these conditional probabilities to build the probabilities for the alphabet table used for 2-bin arithmetic coding engine. For instance, assume that the first bin is in context A with probability A. If the first bin is a zero then the second bin is in context B with probability B; if the first bin is a one then the second bin is in context C with probability C. The probability table can then be built as shown in Table 3.

TABLE 3

| First Bin | Second Bin | Probability |
|---|---|---|
| 0 | 0 | $(1 - P_A[1]) * (1 - P_B[1])$ |
| 0 | 1 | $(1 - P_A[1]) * P_B[1]$ |
| 1 | 0 | $P_A[1] * (1 - P_C[1])$ |
| 1 | 1 | $P_A[1] * P_C[1]$ |

Figure 7B:
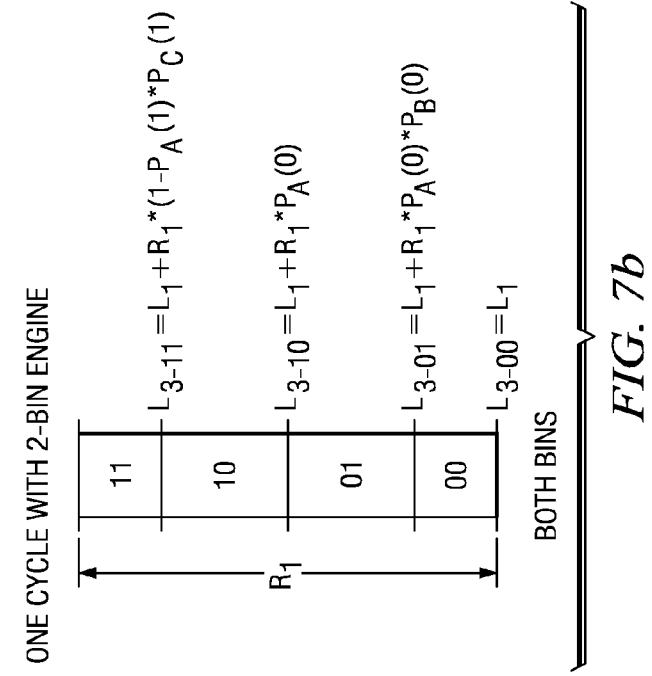
FIG. 7 illustrates the difference between the prior art 1-bin CABAC decoding and the 2-bin CABAC decoding of this invention.
Figure 7A:
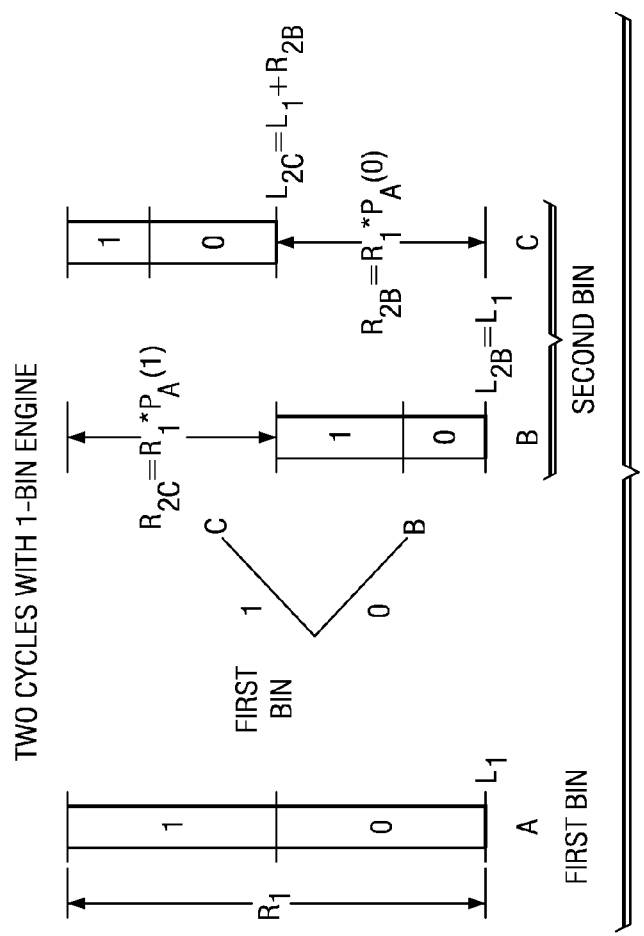

FIGS. 7a and 7b illustrate the difference between the regular 1-bin decoding versus 2-bin decoding. In general there are no constraints on context B and C. The technique of Table 3 covers where both bins are of the same context, either context B or C is equal to context A. In that case the probabilities state update for the context must be taken into account prior to the encoding/decoding. Thus the probability of B or C could be the updated probability of A. Alternatively, contexts B and C could both be different from context A requiring separate computation.

The context management can be simplified by skipping the probability state update as described above for the second bin when the contexts of both bins are the same. As a result, the probability state of the context is updated every two bins. The probability state of context B and/or C equal non-updated probability state of context A during encoding/decoding, and a full update is performed after the encoding/decoding. While this impacts the probability estimate, simulations show that this has negligible impact on coding efficiency.

Because significance map information is immediately followed by coefficient level information, a 2-bin engine can code both sets of data without flushing in between. This reduces the number of bits that are generated. Accordingly dummy bins are only need inserted after coefficient level bins.

FIGS. 7a and 7b illustrate examples of encoding two bins according to the prior art (FIG. 7a) and according to the invention (FIG. 7b). FIG. 7a illustrates that the two bin encoding according to the prior art requires two cycles. For the first bin the prior art process begins with range $R_1$ and value $L_1$. The updated threshold $L_2$ and range $R_2$ for this bin is determined by the probabilities of the corresponding context A, $P_A[0]$ and $P_A[1]$. If the first bit to be encoded is 0, then the prior art process branches to branch B for the second bin. Branch B for encoding the second bin has a range $R_{2B}=R1*PA[0]$ and a probability $L_{2B}=L_1$ corresponding to the lower bound on the 0 portion of the range $R_1$. The next updated range $R_3$ and threshold $L_3$ are set by the probability state of the corresponding context B, PB[0] and $P_B[1]$. If the bit to be encoded is 1, then the prior art process branches to branch C for the second bin. Branch C for encoding the second bin has a range $R_{2C}=R_1*P_A[1]$ and $L_{2C}=L1+R1*P_A[0]$ corresponding to the lower bound of the 1 portion of range $R_1$. The nest updated range $R_3$ and threshold $L_3$ are set by the probability state of the corresponding context C, $P^C[0]$ and $P_C[1]$. This process repeats in the prior art until the number of bins to be encoded are consumed. Decoding proceeds on a similar path. The comparison of a current offset to the current interval L from the corresponding context determines whether the current bit is decoded as a 0 or as a 1. Note this prior art process requires two sequential comparisons: a first comparison with interval $L_1+R_1*P_A[0]$; and a second comparison with interval $L_{2B}+R_2*P_B[0]$ if the first bin is decoded 0 or with interval $L_{2C}+R_2*P_C[0]$ if the first bin is decoded 1.

FIG. 7b illustrates a two-bin encoding according to this invention. Two bins to be encoded determine the resulting range and interval. If the two bins to be encoded are 00, then the range is $R_{3-00}=R_1*P_A[0]*P_B[0]$ and threshold is $L_{3-00}=L_1$. If the two bins to be encoded are 01, then the range is $R_{3-01}=R_1*P_A[ ]*P_B[1]$ and the threshold is $L_{3-01}=L_1+R_1*P_A[0]*P_B[0]$. If the two bins to be encoded are 10, then the range is $R_{3-10}=R_1*P_A[1]*P_C[0]$ and the threshold is $L_{3-10}=L_1+R_1*P_A[0]$. If the two bins to be encoded are 11, then the range is $R_{3-11}=R_1*P_A[1]*P_C[1]$ and the threshold is $L_{3-11}=L_1+R_1*(1-P_A[1])*P_C[1]$. In general the context for the second bin may differ from the context of the first bin. Further the context of the second bin may be dependent upon the value of the first bit, thus the context for B and C may differ. However, these contexts are dependent upon the two bins to be encoded and the context for the second bin is known. Therefore the ranges and thresholds are all determinable in advance. Thus two bins may be encoded in a single pass without requiring a conditional branch in software. In general plural bins N may be encoded using $2^N$ intervals with $2^N-1$ thresholds.

Decoding involves an inverse process. The current offset is compared with the four intervals illustrated in FIG. 7b. The two bins decode to 00 if the current offset Off is less than $L_{3-01}$. The two bins decode to 01 if $L_{3-01}<$Off$<L_{3-10}$. The two bins decode to 10 if $L_{3-10}<$Off$<L_{3-11}$. Finally, the two bins decode to 11 if Off$>L_{3-11}$. Note particularly that thresholds $L_{3-00}$, $L_{3-01}$, $L_{3-10}$ and $L_{3-00}$ can be computed based upon information available before the first and second bins are decoded. Thus two to N bins can be decoded in a single pass.

As previously noted, this approach can be extended from a 2-bin engine to an N-bin engine that encodes or decodes N bins at a time. This approach can be applied to all sets of syntax elements as previously mentioned, not just the significance maps and coefficient levels of this example. It is possible to use N-bin engine only on certain elements and use a single bin engine for the others. This could be uses with significance map and coefficient levels. If an N-bin engine is used on all syntax elements, dummy bins only need to be inserted at the end of the slice after the last syntax element.

Figure 8:
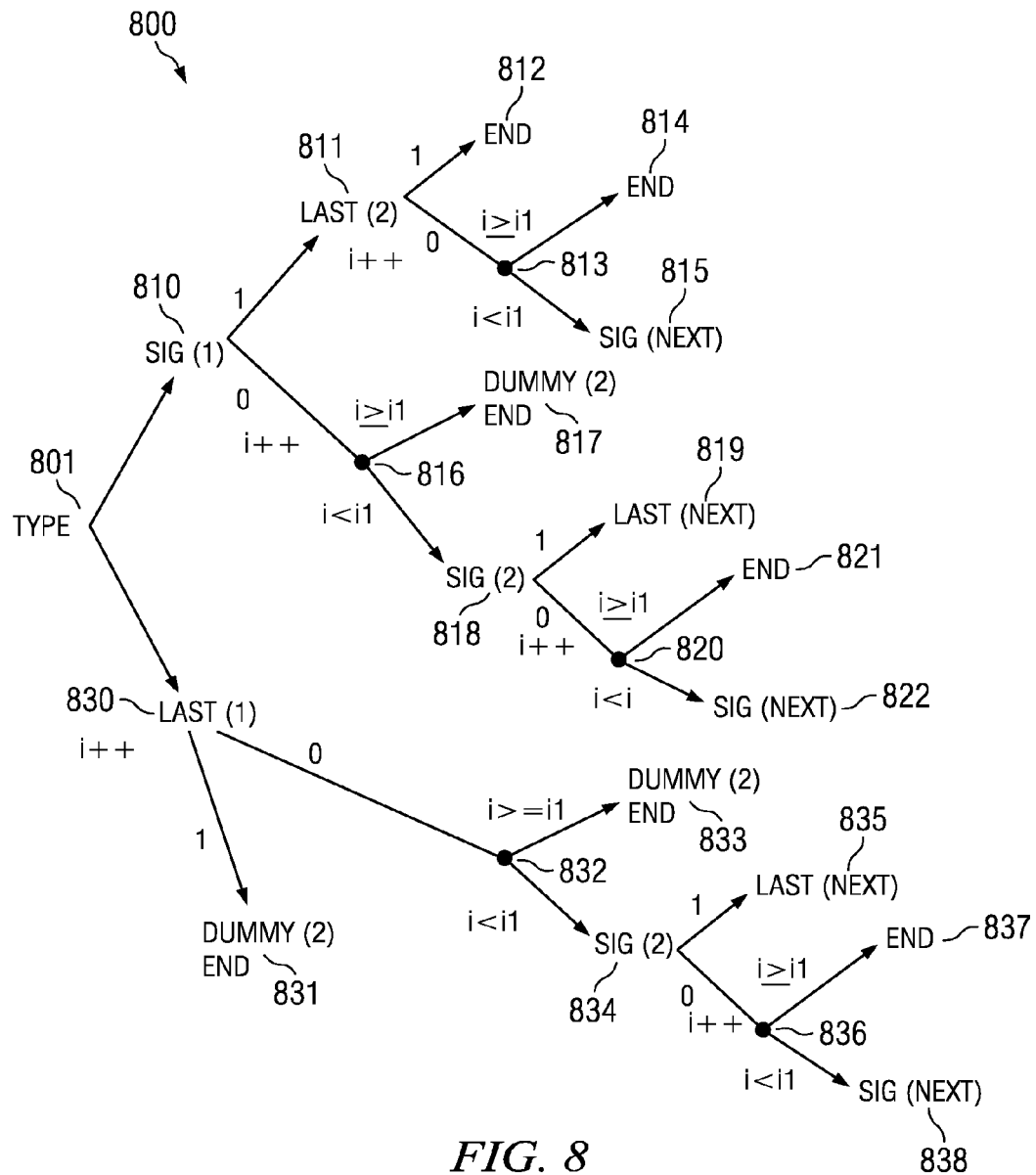
FIG. 8 illustrates an example decision tree determining the possible contexts for 2-bin CABAC decoding of a significance map.

FIG. 8 is an example decision tree used to determine the possible contexts for significance map for decoding N=2 bins per cycle. A similar decision tree can be constructed for any other set of syntax elements. The decision tree 800 of FIG. 8 covers the significance maps significant_coeff_flag and last_significant_coeff_flag. The three possible context types for each bin significant_coeff_flag (sig), last_significant_coeff_flag (last) and dummy. A leaf with end indicates that the significance map has been decoded, while a leaf with next indicates that the next N=2 can begin decoding and we should return to the root of the tree. The first bin (1) of the N=2 binary symbols can either be sig or last. Depending on the coding of the first bin (1), branches for the second bin (2) and the next first bin (next) can be constructed. The variable i keeps track of the number of current nonzero coefficients and ensures that it does not exceed i1 which is the total number of coefficient positions coeff_ctr. Once i equals i1, the process is completed and the significance map designated by end. If i equals i1 at the first bin (1), then the second bin (2) will be a dummy.

Starting at node 801, bin (1) may be decoded as a significance bin (sig) 810 or as a last bin (last) 830. If bin (1) is a significance bin 810, then the context of the following bin depends upon the coding of this bin. A decoded 1 at node 810 means that bin (2) is a last bin (node 811). The variable i is incremented at node 811. A further 1 coding means that the following bin is an end at node 812. A further 0 coding goes to test of node 813. If i≧i1, then the current position is at the maximum position and thus the end at node 814. If i<i1, then the following bin is sig(next) at node 815. The next set of N=2 binary symbols can be decoded with the first bin being a sig by returning to node 810. A 0 coding at node 810 causes variable i to increment. At test node 816 if i≧i1, then the followings bins are dummy(2) followed by end of the significance map at node 817. At test node 816 if i<i1, then the following bin is sig(2) at node 818. For a further 1 coding the following bin is last(next) at node 819 and the next set of N=2 binary symbols can be decoded with the first bin being a last by returning to node 830. For a further 0 coding variable i increments. At test node 820 if i≧i1, then the end of the significance map is reached at node 821. At test node 820 if i<i1, then the next bin is sig(next) 822 and the next set of N=2 binary symbols can be decoded with the first bin being a sig by returning to node 810.

Following node 830, variable i increments. Upon a 1 coding the following bins are dummy(2) and end(next) at node 831. Upon a 0 coding the sequence advances to test node 832. At test node 832 if i≧i1, then the following bins are dummy (2) and the end of the significance map at node 833. At test node 832 if i<i1, then the following bin is sig(2) 834. For a further 1 coding the following bin is last(next) at node 835 and the next set of N=2 binary symbols can be decoded with the first bin being a last by returning to node 830. For a further 0 coding the sequence advances to test node 836. At test node 836 if i≧i1, then the following bin is the end of the significance map at node 837. At test node 836 if i<i1, then the following bin is sig(next) 838 and the next set of N=2 binary symbols can be decoded with first bin being a sig by returning to node 810.

The preferred embodiment described in this application addresses the CABAC engine in the video standard H.264. However, one skilled in the art would realize that this technique can be applied to other standard such as SVC, MVC, China AVS, etc.

The prior art H.264 CABAC uses a single bin per cycle engine for arithmetic encoding done in H.264. For our high performance CABAC, this invention uses multi-bit per cycle engine, such as a 2-bin per cycle engine, for the significance map and the coefficient levels to increase the overall throughput. Applying a 2-bin/cycle coding on both the significance map bins and coefficient levels, the overall CABAC throughput and performance can potentially be improved by 1.5 to 2 times for the average 720p bit-stream (QP=22). With N-bin per cycle coding, this throughput can be further increased. This reduces the operating frequency requirements and power consumption.

What is claimed is:

1. A method of context adaptive binary arithmetic coding (CABAC) comprising:
grouping a plurality N syntax elements together for coding;
dividing a range into $2^N$ subranges in recursive binary stages, where a context corresponding to an initial binary symbol divides said range into two parts according to a context of a digital state of the initial binary symbol to be coded, and respective contexts corresponding to a next binary symbol divides each prior subrange into two parts corresponding to corresponding a context of a digital state of said next binary symbol until all syntax elements are considered; and
selecting an offset located in a unique subrange determined by probability states of said N binary symbols.

2. The method of claim 1, wherein:
when a total number of binary symbols to be coded does not equal an integral multiple of N, coding a number of dummy binary symbols at an end of a grouping of a plurality N binary symbols with a highly skewed probability to thereby minimize reduction in coding efficiency.

3. The method of claim 1, wherein:
when N=2, a probability of a context A that a first binary symbol is 1 is $P_A[1]$ and a probability of a context B that a second binary symbol is 1 is $P_B[1]$, then said first and second binary symbols are coded as follows:

| First binary symbol | Second binary symbol | Probability |
| --- | --- | --- |
| 0 | 0 | $(1 - P_A[1]) * (1 - P_A[1])$ |
| 0 | 1 | $(1 - P_A[1]) * P_B[1]$ |
| 1 | 0 | $P_A[1] * (1 - P_B[1])$ |
| 1 | 1 | $P_A[1] * P_B[1]$. |

4. The method of claim 1, wherein:
when N=2, a probability of a context A that a first binary symbol is 1 is $P_A[1]$, a probability of a context B that a second binary symbol is 0 for a 0 in said first binary symbol is $P_B[1]$ and a probability of a context B that a second binary symbol is 1 for a 1 in said first binary symbol is $P_C[1]$, then said first and second binary symbols are coded as follows:

| First binary symbol | Second binary symbol | Probability |
| --- | --- | --- |
| 0 | 0 | $(1 - P_A[1]) * (1 - P_B[1])$ |
| 0 | 1 | $(1 - P_A[1]) * P_B[1]$ |
| 1 | 0 | $P_A[1] * (1 - P_C[1])$ |
| 1 | 1 | $P_A[1] * P_C[1]$. |

5. The method of claim 1, wherein:
said plurality of binary symbols includes a significance map and corresponding coefficient levels.

6. The method of claim 1, further comprising the step of:
updating a probability state of a context only after encoding each N binary symbols.

7. A method of decoding context adaptive binary arithmetic coding (CABAC) data comprising:
dividing a range into $2^N$ subranges in recursive binary stages, where a context corresponding to an initial binary symbol divides said range into two subranges according to a probability state of a context of a digital state of the initial binary symbol to be coded, and respective contexts corresponding to a next binary symbol divides each prior subrange into two subranges corresponding to probability state of a context of a digital state of said next binary symbol until all binary symbols are considered;
comparing an offset to said $2^N$ subranges; and
selecting N binary symbols corresponding to said offset level dependent upon a corresponding one of said $2^N$ subranges including said offset.

8. The method of claim 7, wherein:
when a total number of binary symbols to be decoded does not equal an integral multiple of N, decoding a number of dummy binary symbols at an end of a grouping of a plurality N binary symbols with a highly skewed probability to thereby minimize reduction in decoding efficiency.

9. The method of claim 7, wherein:
when N=2, a probability state of a context A that a first binary symbol is 1 is $P_A[1]$ and a probability state of a context B that a second binary symbol is 1 is $P_B[1]$, then said first and second binary symbols are decoded as follows:

| First binary symbol | Second binary symbol | Probability |
|---|---|---|
| 0 | 0 | $(1 - P_A[1]) * (1 - P_B[1])$ |
| 0 | 1 | $(1 - P_A[1]) * P_B[1]$ |
| 1 | 0 | $P_A[1] * (1 - P_B[1])$ |
| 1 | 1 | $P_A[1] * P_B[1]$. |

10. The method of claim 7, wherein:
when N=2, a probability state of a context A that a first binary symbol is 1 is $P_A[1]$, a probability state of a context B that a second binary symbol is 1 for a 0 in said first binary symbol is $P_B[1]$ and a probability state of a context that a second binary symbol is a 1 for a 1 in said first binary symbol is $P_C[1]$, then said first and second binary symbols are decoded as follows:

| First binary symbol | Second binary symbol | Probability |
|---|---|---|
| 0 | 0 | $(1 - P_A[1]) * (1 - P_B[1])$ |
| 0 | 1 | $(1 - P_A[1]) * P_B[1]$ |
| 1 | 0 | $P_A[1] * (1 - P_C[1])$ |
| 1 | 1 | $P_A[1] * P_C[1]$. |

11. The method of claim 7, wherein:
said plurality of binary symbols includes a significance map and corresponding coefficient levels.

12. The method of claim 7, further comprising the step of:
updating a probability state of a context only after decoding each N binary symbols.

* * * * *